United States Patent [19]
Lowe

[11] Patent Number: 5,691,634
[45] Date of Patent: Nov. 25, 1997

[54] WYE SERVICE POWER METER

[75] Inventor: Coy Stephen Lowe, Talking Rock, Ga.

[73] Assignee: Schlumberger Industries, Inc., Norcross, Ga.

[21] Appl. No.: 522,904

[22] Filed: Sep. 1, 1995

[51] Int. Cl.⁶ .............. G01R 21/06; G01R 11/40
[52] U.S. Cl. .............. 324/107; 324/142; 364/483
[58] Field of Search .................. 324/142, 107; 364/483, 571.01

[56] References Cited

U.S. PATENT DOCUMENTS

| | | | |
|---|---|---|---|
| 4,595,988 | 6/1986 | Chiffert et al. | 324/107 |
| 4,896,106 | 1/1990 | Voisine et al. | 324/107 |
| 5,059,896 | 10/1991 | Germer et al. | 324/142 |
| 5,301,121 | 4/1994 | Garverick et al. | 364/571 |

*Primary Examiner*—Ernest F. Karlsen
*Assistant Examiner*—Anh Phung
*Attorney, Agent, or Firm*—Leonard W. Pojunas

[57] ABSTRACT

A device for monitoring power in a wye power service having three phases includes a sampling element arranged and configured to sample a current value and a voltage value from each of the three phases. A processor, coupled to said sampling element, calculates power either (i) by using the current value and the voltage value for the at least one phase when the voltage value for the at least one phase is available, or (ii) by using the current value for the at least one phase and the voltage values for the other two phases if the voltage value for the at least one phase is unavailable.

14 Claims, 7 Drawing Sheets

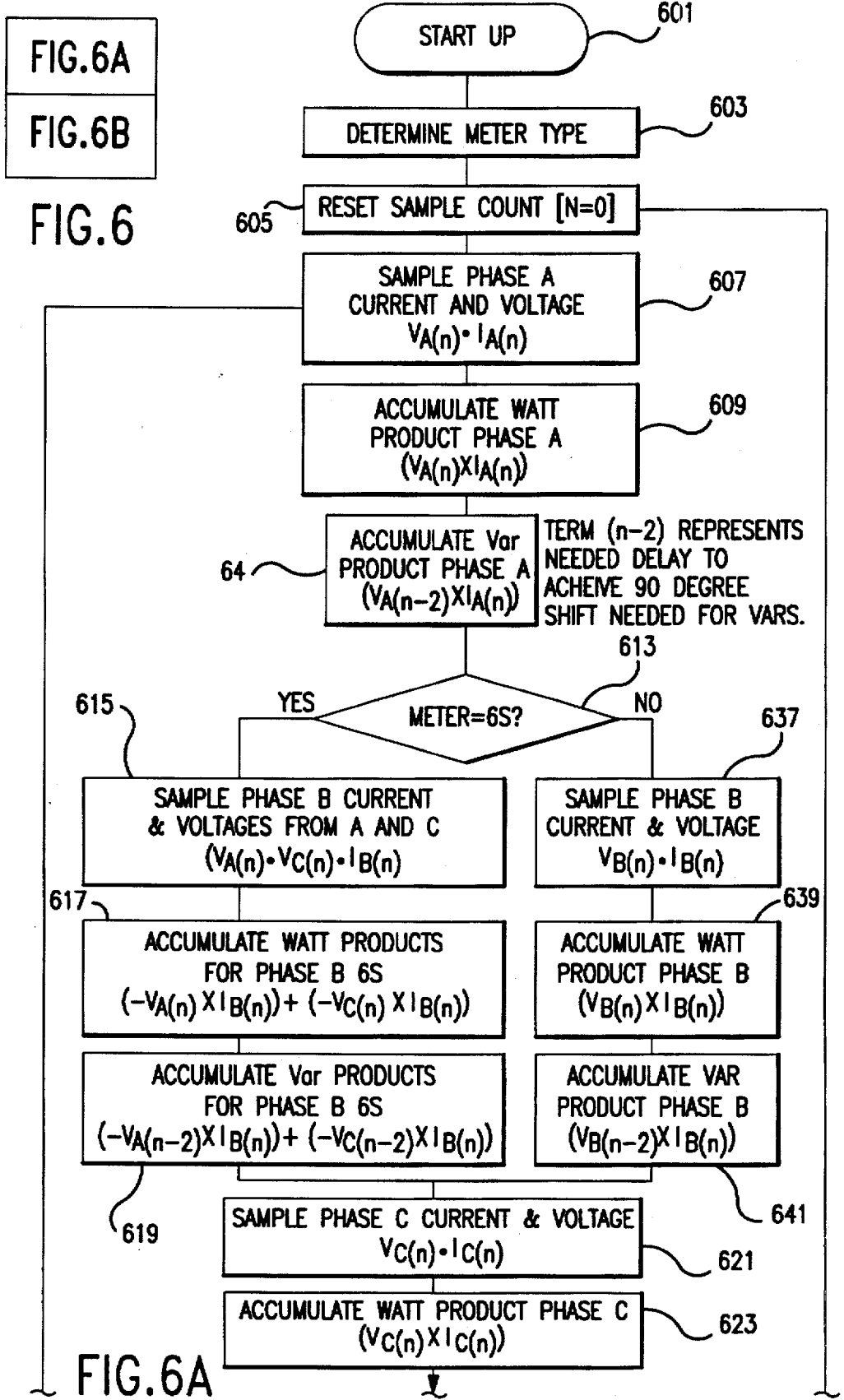

WYE SERVICE POWER METER

BACKGROUND AND SUMMARY

This invention relates to a meter for monitoring power usage in a multiple phase electrical service.

In order to deliver electrical energy to a factory or other high power user, a four wire wye service, having one wire for each of three phases of power plus one wire for neutral, is often employed. A representation of a four wire wye service is illustrated in FIG. 1, in which three phases, A, B, C, and neutral N are arranged in a wye ("Y") configuration. Symbols $\underline{V}_A$, and $\underline{V}_B$, and $\underline{V}_C$ represent voltage vectors for potentials between N and terminals A, B, C, respectively. Symbols $\underline{I}_A$, $\underline{I}_B$, and $\underline{I}_C$ represent current vectors for the three phases A, B, C, respectively.

Power for each of the phases A, B, and C is determined by calculating the scalar product (or "dot" product) of the voltage vector and the current vector for the phase under consideration, as represented in Equations (i), (ii), and (iii):

$$P_A = \underline{V}_A \cdot \underline{I}_A \quad \text{(i)}$$

$$P_B = \underline{V}_B \cdot \underline{I}_B \quad \text{(ii)}$$

$$P_C = \underline{V}_C \cdot \underline{I}_C \quad \text{(iii)}$$

The total power for the service is calculated by summing the power for each of the three phases A, B, and C, as represented in Equations (iv) and (v):

$$P_{Total} = P_A + P_B + P_C \quad \text{(iv)}$$
$$= (\underline{V}_A \cdot \underline{I}_A) + (\underline{V}_B \cdot \underline{I}_B) + (\underline{V}_C \cdot \underline{I}_C) \quad \text{(v)}$$

In an ideal power distribution system, because the voltage and current vectors are in phase with each other, all power would be real (or "active") power, measured in units of Watts. In practical applications, however, reactive loads cause the voltage and current vectors to include a component that 90° out of phase. This out-of-phase component produces imaginary (or "reactive") power consumption. The imaginary component is measured in units of volts-amps reactive, or VARs. The imaginary component of power is calculated by delaying the voltage vector from the current vector by −90°, as represented in Equations (vi), (vii), and (viii):

$$VAR_A = \underline{V}_{A(-90°)} \cdot \underline{I}_A \quad \text{(vi)}$$

$$VAR_B = \underline{V}_{B(-90°)} \cdot \underline{I}_B \quad \text{(vii)}$$

$$VAR_C = \underline{V}_{C(-90°)} \cdot \underline{I}_C \quad \text{(viii)}$$

In order to accurately monitor power usage, the power provider must be able to determine the total amount of power—both real and imaginary—that is consumed by a customer. In many applications (e.g., so-called 9S and 16S metering), the power monitoring calculations are performed by providing both voltage and current for each of the three phases in the service to the meter, as well as a parameter representative of the neutral, N. This allows Equation (v) (known as the "unrestricted" metering equation) to be used to calculate total real power consumption. Similarly, total imaginary power consumption may be calculated by summing the individual imaginary power components for each of the three phases represented in equations (vi), (vii), and (viii).

In certain types of power metering (e.g., 6S metering), however, only two of the three line-to-neutral voltages are brought to the meter from the four wire wye service. Accordingly, the unrestricted metering equation cannot be used by a 6S meter in calculating power for a four wire wye service because one of voltages $\underline{V}_A$, $\underline{V}_B$, and $\underline{V}_C$ is not provided to the meter. Instead, the 6S meter uses a derivative of the unrestricted metering equation, which is estimated by placing a phase-balance restriction upon the service, which simplifies the equation. FIG. 2 shows that $\underline{V}_A$, $\underline{V}_B$, and $\underline{V}_C$ maintain approximately the same magnitude and phase relationship. The phase diagram of FIG. 2 uses a plurality of voltage vectors $\underline{V}_A$, $\underline{V}_B$, and $\underline{V}_C$, which have substantially the same magnitude. Each consecutive vector is separated by approximately 120°.

The above assumption allows power for a particular phase to be calculated by using the current vector for the phase under consideration and the voltage vectors for the other two phases. For example, assuming the voltages for phases A and C are available, and the voltage for phase B is unavailable, the power for phase B is calculated as follows. First, because each of the three phases is assumed to have the same magnitude and phase relationship, voltage vector B is represented by the following equation:

$$\underline{V}_B = (-\underline{V}_A) + (-\underline{V}_C) \quad \text{(ix)}$$
$$= -(\underline{V}_A + \underline{V}_C) \quad \text{(x)}$$

Similarly, in order to calculate the reactive power, voltage vector B is delayed by −90°, as represented by the following equation:

$$\underline{V}_{B(-90°)} = -(\underline{V}_{A(-90°)} + \underline{V}_{C(-90°)}) \quad \text{(xi)}$$

Next, the power (Watts) for phase B is calculated by Equation (xii), below, which is derived by substituting Equation (x) into Equation (ii). Similarly, the reactive power (VARs) is calculated by Equation (xiii), below, which is derived by substituting Equation (xi) into Equation (vii), as follows:

$$P_B = -(\underline{V}_A + \underline{V}_C) \cdot \underline{I}_B \quad \text{(xii)}$$

$$VAR_B = -(\underline{V}_{A(-90°)} + \underline{V}_{C(-90°)}) \cdot \underline{I}_B \quad \text{(xiii)}$$

Because voltages and currents for the remaining two phases—A and C—are available, the real and reactive power components for phases A and C can be calculated using Equations (i), (iii), (vi) and (viii), respectively.

The total power for a 6S meter hence may be calculated using the following equation:

$$P_{Total} = \underline{V}_A \cdot (\underline{I}_A - \underline{I}_B) + \underline{V}_C \cdot (\underline{I}_C - \underline{I}_B) \quad \text{(xiv)}$$

Equation (xiv) represents the equation that is implemented on an electromechanical 6S meter. The current $\underline{I}_B$ is subtracted from $\underline{I}_A$ to form a single current which is then multiplied by $\underline{V}_A$ to form one element of the metering. The current $\underline{I}_B$ also is subtracted from $\underline{I}_C$ to form a single current which is then multiplied by $\underline{V}_C$ to form the other element of the metering. The sum of the power registered on these two elements represents the total energy registration of the 6S meter.

The inventors of the present invention recognized that these two materially different ways of metering power could not be handled by a single unit, and developed a way to obviate this drawback.

The control circuitry for a solid state power meter according to the present invention allows the same basic circuit board to be used in a number of different meters having varying metering requirements; the 6S, 9S, and 16S described above. The circuit board has the capabilities to accept all three currents from a three phase, four wire wye service and to accept either all three or only two of the voltages from the wye service depending on the meter wiring scheme. Power is calculated using either (i) an unrestricted metering equation which uses the voltage and current for each phase; or (ii) a phase-balance restricted metering equation in which power for the phase for which the voltage is unavailable is calculated using the voltages of the other two phases and the current for the phase under consideration. Hence, the same control circuitry can be used in different types of meters. Because the same circuit board may be used in 6S and 9S meters, among others, a marked increase in manufacturing efficiency, and corresponding decreases in time and expense, are realized.

Other advantages and features will become apparent from the following description and claims.

BRIEF DESCRIPTION OF THE DRAWINGS

FIGS. 6a and 6b constitute a flowchart showing operation of a meter.

DETAILED DESCRIPTION

Figure 1:
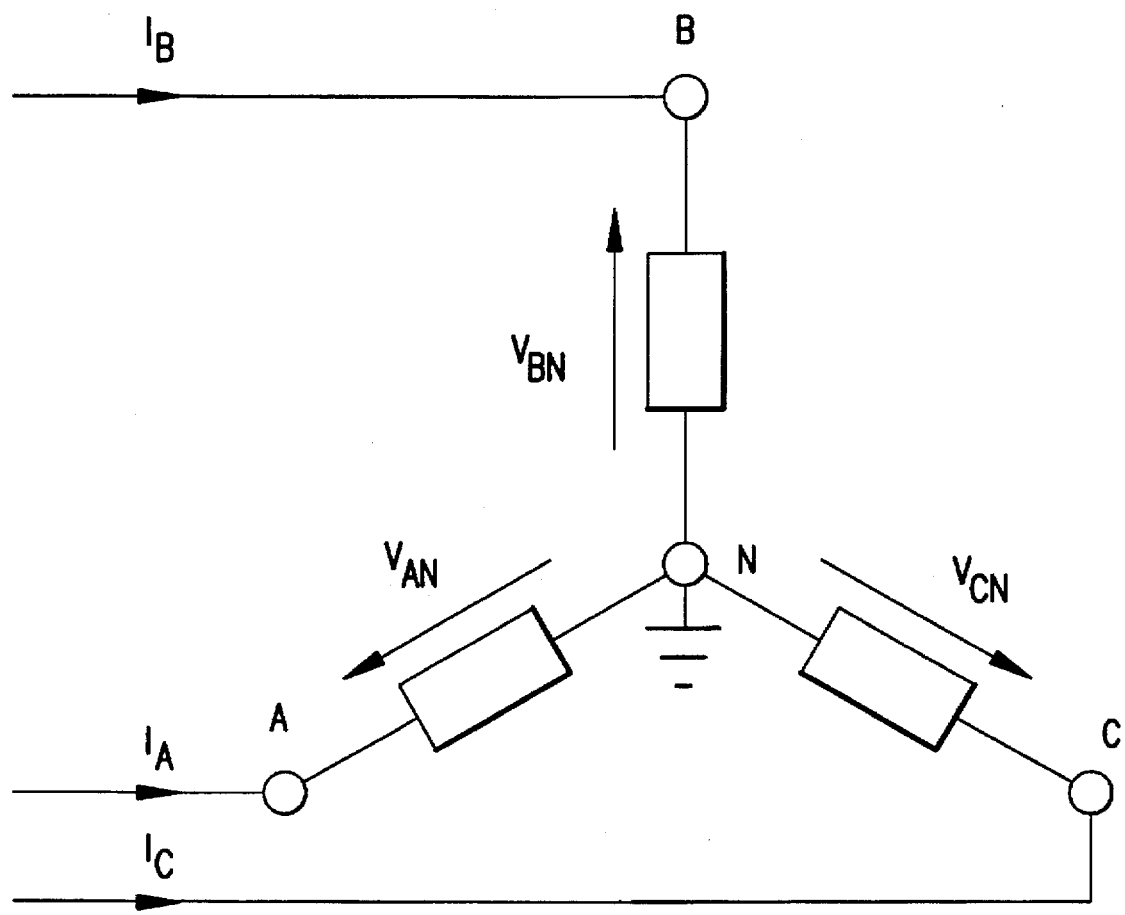
FIG. 1 is a representation of a four wire wye service.
Figure 2:
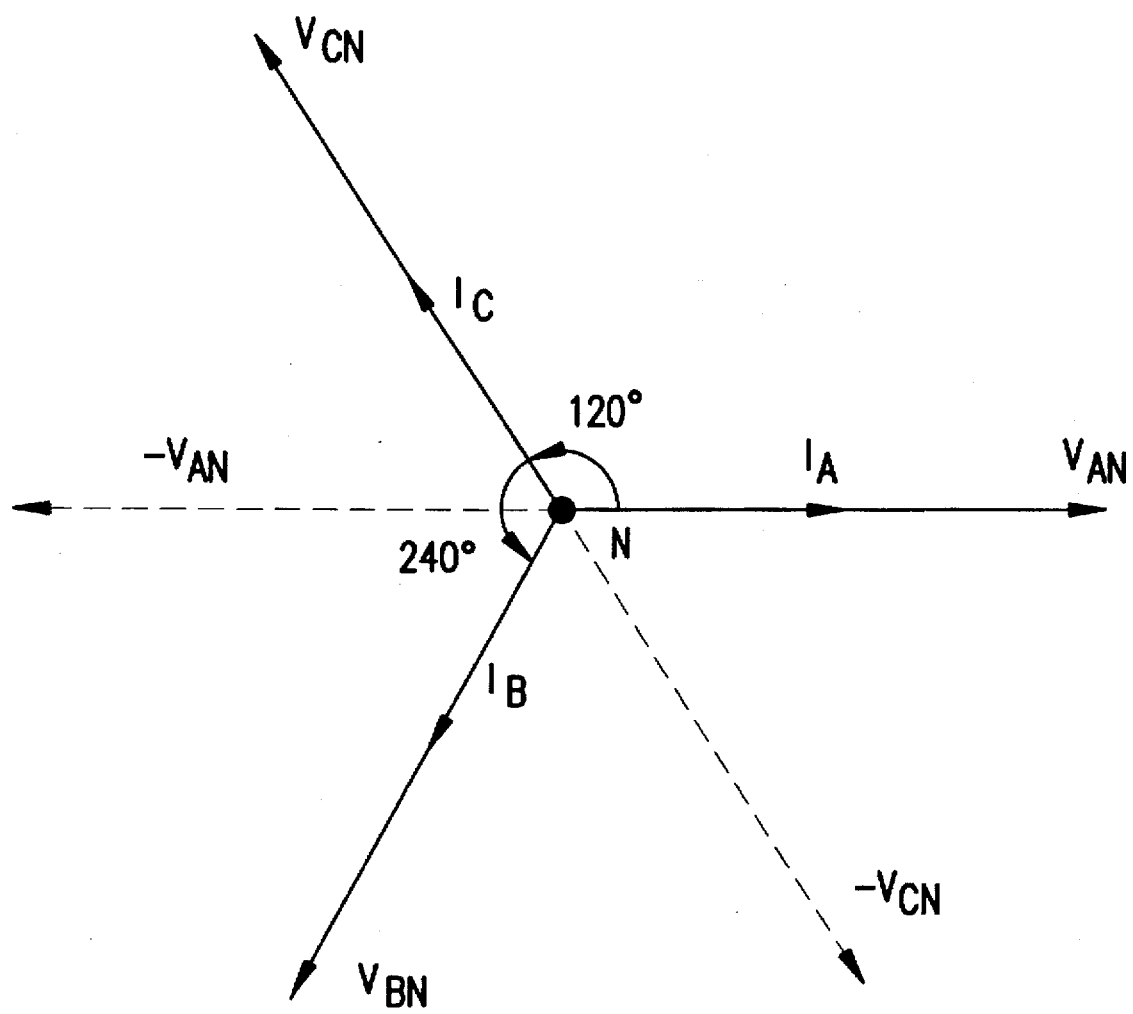
FIG. 2 is a phase diagram for a four wire wye service.
Figure 3:
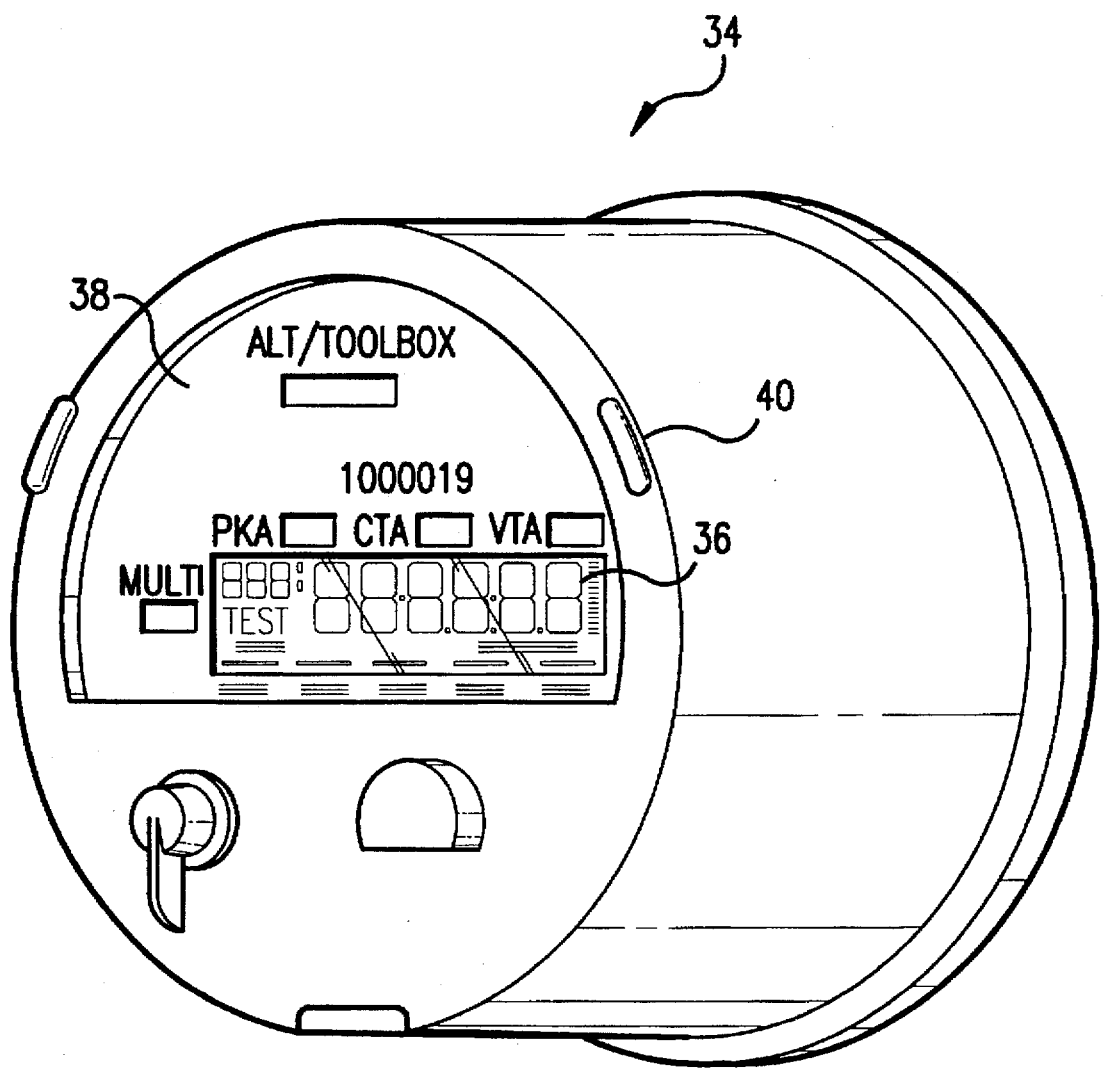
FIG. 3 is a solid state power meter.

In many industrial applications, a polyphase solid state meter, as opposed to a mechanical or electromechanical meter, is used to determine real power (Watts) and imaginary power (VARs) associated with a particular power line. FIG. 3 shows a front perspective view of a typical solid state meter 34 which includes a digital display 36 for displaying power usage; a protective face plate 38; and a cover 40.

Figure 4:
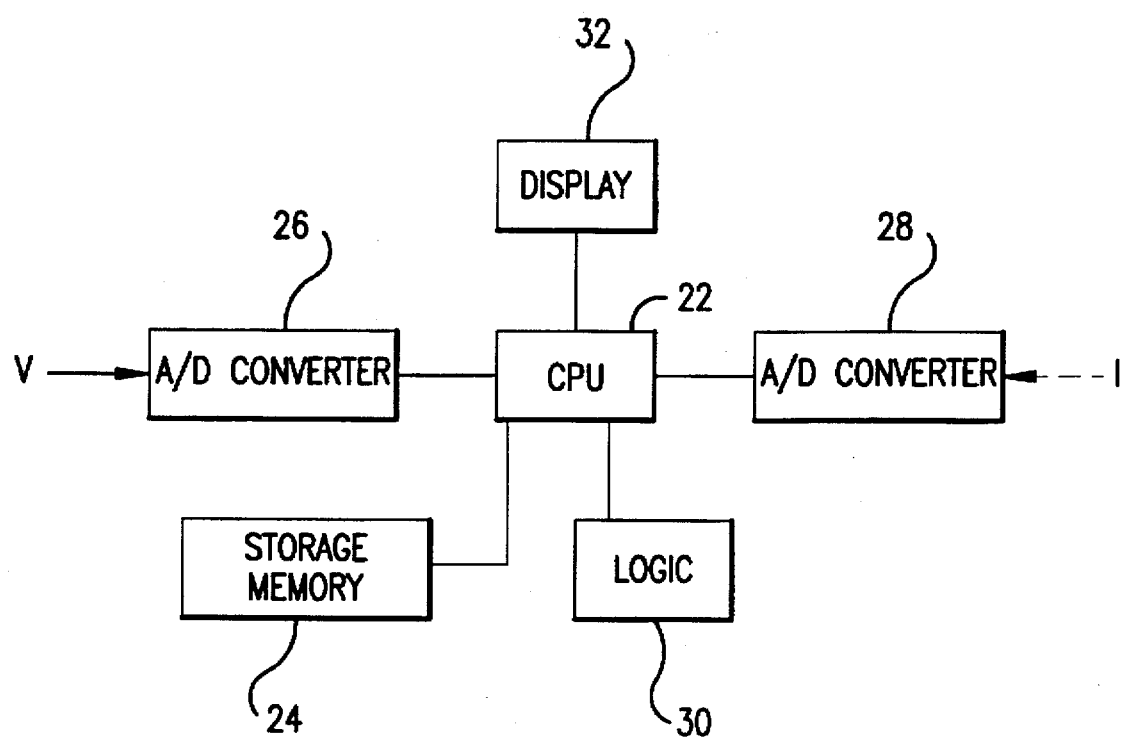
FIG. 4 is a block diagram of a power monitor system.

The main components of a solid state meter are illustrated in block diagram form in FIG. 4. The meter system includes two A/D converters 26 and 28 for respectively sampling voltage values and current values from the wye service. The sampled current and voltage values are provided to central processing unit (CPU) 22 which controls various meter functions and calculates energy usage. A single chip computer (e.g., Motorola 68HC11 series) having on-board read only memory (ROM), random access memory (RAM), various timers and input/output ports may be used as CPU 22. The on-board ROM contains a firmware program that is executed by CPU 22 to control meter functions. A storage memory 24 is provided to store sampled data values, while logic element 30 includes circuitry to perform, under control of CPU 22, metering functions, energy demand calculations, meter calibration, etc. Display 32 can be a digital display like display 36 of FIG. 3.

Although four wire wye service meters such as 9S and 16S use currents and voltages from all three phases in registering power consumption, 6S metering, in which all three currents but only two phase voltages are available, remains in use in many service installations. Accordingly, the polyphase solid state meter of the present invention uses analog/digital (A/D) sampling for calculation of voltages, currents, and energy registration, and provides the capability of registering power using conventional 6S metering techniques.

Specifically, the solid state meter according to the present invention that is employed in a 6S metering environment meters energy as accurately as an electromechanical 6S meter in both polyphase and series configurations and does so using only two of the three phases' line-to-neutral voltages.

At the same time, the control circuitry for the present solid state meter retains the ability to employ the unrestricted metering equation for registering power when placed in a metering environment such as the 9S environment. In this way, although the 6S and 9s are uniquely different meters, they may use essentially the same circuitry. All that differs is the connection of the meter to the service. Accordingly, a uniform configuration of control circuitry can be used among different types of meters, thereby streamlining the development process and reducing attendant manufacturing time and costs.

One embodiment of the control circuitry for a polyphase solid state meter has the capability to register power both using the unrestricted metering equation, as well as the restricted phase-balance equation (i.e., the 6S metering equation). In addition, the control circuitry has the capability to receive currents from all three phases of a four wire wye service, and to receive voltages either from two or three phases, depending on how many are available. Consequently, the control circuitry may be used either in a 6S meter or in other metering systems that make use of the unrestricted metering equation (e.g., 9S or 16S metering).

The preferred meter of the present invention is a fully solid state, polyphase meter that employs the above-described features. This meter has a basic configuration which handles 6S, 9S and 16S metering environments. In the 9S and 16S mode, the meter control circuitry accepts voltages from all three phases and calculates power using the unrestricted metering equation.

In the 6S metering mode, in contrast, only two of the three line-to-neutral voltages are brought to the meter from the four wire wye service. In this mode, the meter control circuitry accepts the two available voltages and calculates power using the phase-balanced restricted metering equations (xiii) and (xiv).

Figure 5:
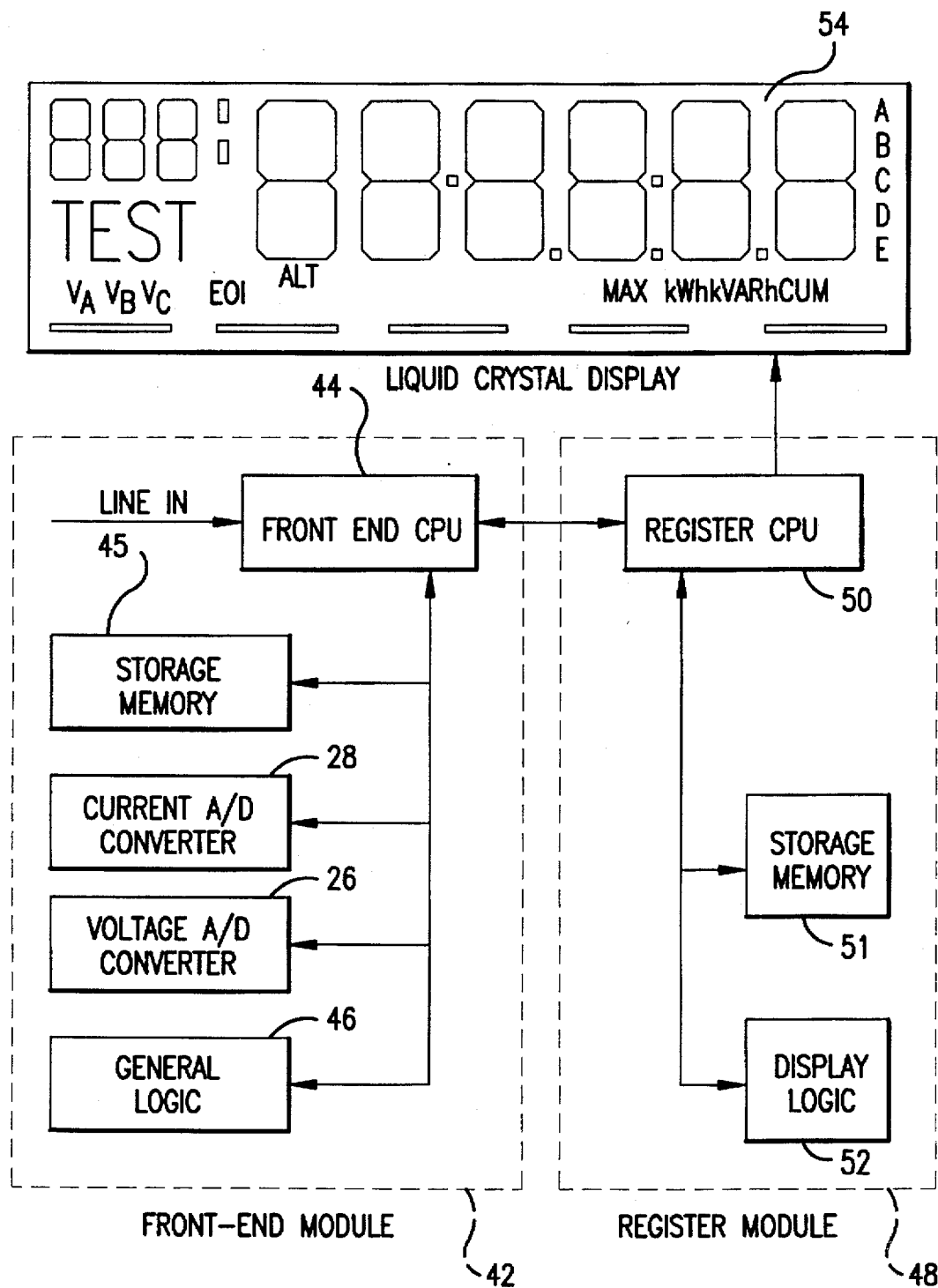
FIG. 5 is a block diagram of the control circuitry for a power monitor system.

As shown in FIG. 5, the present meter includes front-end module 42, register module 48, and liquid crystal display (LCD) 54. Front-end module 42 (including Front End CPU 44, A/D converters 26 and 28, storage memory 45, and general logic 46) controls metering functions such as voltage and current measurements, power calculations, power calibrations, etc., by means of a firmware program stored in on-board ROM and executed by Front End CPU 44. Register module 48, on the other hand, has its own firmware program to control non-metering system functions such as display and instrumentation, input/output, and the like.

Operation of a 6S meter according to the present invention is described in more detail with reference to the flowchart in FIGS. 6a and 6b. Upon start-up of the meter in step 601, Front End CPU 44 reads, in step 603, a meter identifying variable from the firmware embedded in the on-board ROM to identify the type of metering environment (e.g., 6S, 9S, 16S) in which the control circuitry is to be used. The sample counter, n, is initialized to 0 in step 605.

In step 607, Front End CPU 44 causes current A/D converter 28 to sample a current value and voltage A/D converter 26 to sample a voltage value from phase A of the wye service. These current and voltage samples are represented as $I_A(n)$ and $V_A(n)$, respectively, where n is the sample counter.

Next, in step 609, the Watt product (V×I) for phase A at sample n is accumulated for later use in calculating calibrated and aggregate Watts and VARs, as discussed in greater detail below. Similarly, at step 611, the VAR product $(V_{-90} \times I)$ for phase A at sample n is accumulated for later use. The 90° phase shift of the phase A voltage is achieved by using sample number (n-2)—i.e., VAR product=$V_A(n-2) \times I_A(n)$.

At step 613, Front End CPU 44 examines the meter identifying variable to determine if the meter is operating in a 6S metering environment. When Front End CPU 44 determines at step 613 that the meter identifying variable in the firmware is set to correspond to a meter other than a 6S meter, step 637 is executed in which Front End CPU 44 causes current A/D converter 28 and voltage A/D converter 26 to sample, respectively, a current value and a voltage value for phase B of the wye service. These current and voltage samples are represented as $I_B(n)$ and $V_B(n)$, respectively, where n is the sample counter.

At steps 639 and 641, the Watt product and the VAR product for phase B are calculated in essentially the same manner as for phase A, discussed above with respect to steps 609 and 611.

On the other hand, if, at step 613, the meter identifying variable indicates that the meter is operating in a 6S metering environment, Front End CPU 44 causes current A/D converter 28 to sample a current value for phase B, $I_B(n)$, and voltage A/D converter 26 to sample voltage values from that used for phases A and C, $V_A(n)$ and $V_C(n)$, respectively, in step 615.

Next, in steps 617 and 619 the Watt and VAR products for phase B are accumulated. However, because the phase B voltage in 6S metering is unavailable for measurement, the Watt and VAR products for phase must be calculated in a manner different from phases A and C. Specifically, the Watt product for phase B in a 6S meter environment is determined according to Equation (xv):

$$\text{Watt Product} = (-V_A(n) \times I_B(n)) + (-V_C(n) \times I_B(n)) \quad \text{(xv)}$$

The VAR product for phase B in a 6S meter environment is determined according to Equation (xvi):

$$\text{VAR Product} = (-V_A(n-2) \times I_B(n)) + (-V_C(n-2) \times I_B(n)) \quad \text{(xvi)}$$

In step 621 Front End CPU 44 causes current A/D converter 28 to sample a current value, $I_C(n)$, and voltage A/D converter 26 to sample a voltage value, $V_C(n)$, from phase C of the wye service. In steps 623 and 625, the Watt and VAR products for phase C at sample n are accumulated in essentially the same manner as for phase A, discussed above with respect to steps 609 and 611. As with phases A and B, the phase C Watt and VAR products will be used subsequently in calculating calibrated and aggregate Watts and VARs.

After the sample counter has been incremented in step 627, Front End CPU 44 determines, in step 629, if a predetermined number of samples, k, has been measured. Multiple samples are used because power usage varies significantly from instant to instant in an actual installation. Because the sampled values of current and voltage represent discrete values measured at isolated points in time, using only a single set of sampled values would result in incomplete and potentially erroneous power registration. Accordingly, in order to calculate actual power consumption more accurately, the meter registers power by summing over the predetermined number of samples, k (e.g., 481). The quantum of power that is measured over k samples is referred to an "energy increment."

In the case that the number of measured samples n is less than the predetermined number of samples k, the process returns to step 607 to sample the next iteration of current and voltage values for phase A. Steps 607 through 629 are repeated k times—i.e., until k sets of Watt products and VAR products are accumulated for each phase.

After an appropriate number of products have been accumulated, power calculations are performed in step 631 to determine the calibrated Watts and VARs for each of the three phases of the four wire wye service. Power for phases A and C is calculated using the following equations in which Equation (xvii) represents the active power component and Equation (xviii) represents the reactive power component:

$$P_f = Q/K \left[ \{n=1 \text{ to } k\} \Sigma V_f(n) \times I_f(n) \right] \quad \text{(xvii)}$$

$$VAR_f = Q/K \left[ \{n=1 \text{ to } k\} \Sigma V_f(n-2) \times I_f(n) \right] \quad \text{(xviii)}$$

In Equations (xvii) and (xviii), f is the phase under consideration (A or C); $V_f(n)$ is individual voltage sample number n for the phase under consideration; $V_f(n-2)$ is individual voltage sample number n, delayed by $-90°$, for the phase under consideration; $I_f(n)$ is individual current sample number n for the phase under consideration; k is the predetermined number of samples over which power is measured; and Q is a measured, meter-specific constant to account for gain, calibration, and other such parameters that vary from meter to meter.

In the above calculations, Front End CPU 44 can use the unrestricted metering equation to calculate active and reactive power for phases A and C because voltage and current values are available to the 6S meter for each of those phases. However, because an actual voltage for phase B is not provided to the voltage A/D converter to be sampled, the following phase-balance restricted equations are used by Front End CPU 44 to calculate active and reactive power, respectively, for phase B:

$$P_B Q/K \left[ \{n=1 \text{ to } k\} \Sigma (-V_A(n) \times I_B(n)) + (-V_C(n) \times I_B(n)) \right] \quad \text{(xix)}$$

$$VAR_B Q/K \left[ \{n=1 \text{ to } k\} \Sigma (-V_A(n-2) \times I_B(n)) + (-V_C(n-2) \times I_B(n)) \right] \quad \text{(xx)}$$

In Equations (xix) and (xx), $V_A(n)$ and $V_C(n)$ are individual voltage samples number n for phases A and C, respectively; $V_A(n-2)$ and $V_C(n-2)$ are individual voltage samples number n, effectively delayed by $-90°$, for phases A and C, respectively; and $I_B(n)$ is individual current sample number n for phase B. Q and k have the same meaning as in Equations (xvii) and (xviii).

After Front End CPU 44 calculates the power for each individual phase, the total, aggregate power is calculated in step 633 by summing the individual phase components for Watts and VARs, respectively.

Next, in step 635, Front End CPU 44 passes the calculated energy increment to Register CPU 50, which, under control of display logic 52 and its own ROM-embedded firmware, displays the power registration information on LCD 54. Register CPU 50 also stores the energy increment information in storage memory 51 for future reference.

Thereafter, Front End CPU 44 returns to step 605 to begin sampling for the next energy increment.

Figure 6B:
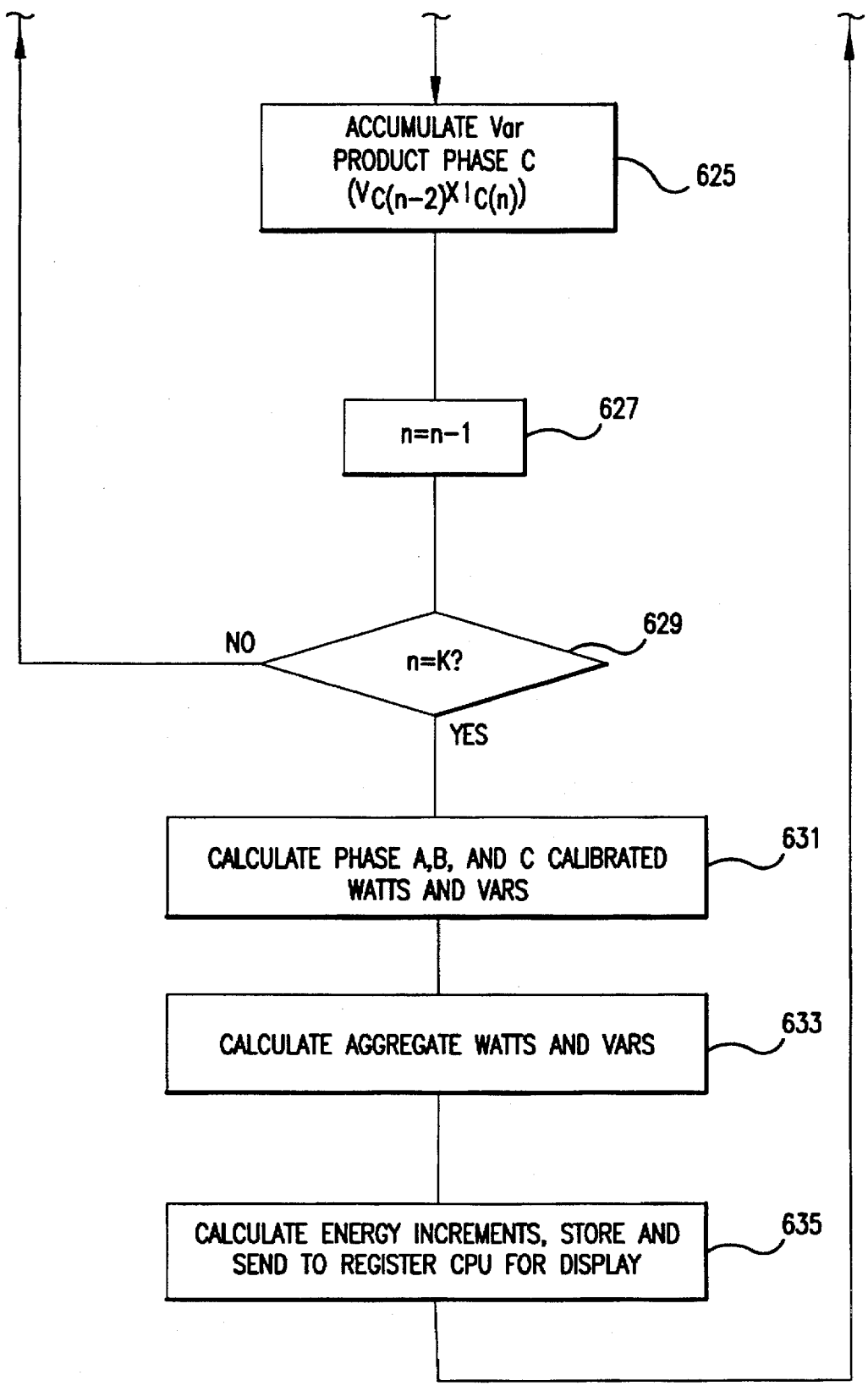

The same control circuitry and operation as shown in FIGS. 5 and 6a–b, and as described above with respect to the 6S meter, can be used in other types of meters, for example, in 9S and 16S meters, which utilize the unrestricted metering equation rather than the restricted phase-balance equations employed in the 6S meter. All that needs to be done is to change the value of the meter identifying variable in the firmware embedded in the on-board ROM in Front End CPU 44 to identify the type of metering configuration in which the control circuitry is to be used. FIGS. 6a and 6b comprise an example of a selection mechanism.

As indicated in FIGS. 6a–b, operation of the meter control circuitry in a 16S meter is the same as its use in a 9S meter. However, certain burden resistors on the circuit card have to be replaced for use in the 16S meter to account for a difference in current ratings between the meters—namely, a 16S meter is rated at 200 amperes whereas the 9S (as well as the 6S) is rated only at 20 amperes.

Although the above-described embodiment uses firmware embedded in on-board ROM, those skilled in the art will recognize that various modifications could be made without departing from the spirit of the invention as defined by the appended claims. For example, a separate ROM (i.e., off board the CPU) or other type of non-volatile memory element (e.g., magnetic media, battery backed-up RAM, etc.) could be used to store the firmware control program. Alternatively, if a volatile RAM is used in place of the ROM, the firmware appropriate to the particular metering configuration could be downloaded to the RAM from a host computer each time the meter was turned on.

Further details of the control circuitry used in a solid state power meter are described in co-pending U.S. patent application Ser. No. 08/037,938, which is incorporated herein by reference.

Other embodiments are within the scope of the following claims.

What is claimed is:

1. A device for monitoring power in a wye power service having three phases, said device comprising:
    a sampling element arranged and configured to sample a current value and a voltage value from each of the three phases; and
    a processor, coupled to said sampling element, to calculate power (i) by using the current value and the voltage value for the at least one phase when the voltage value for the at least one phase is available, and (ii) by using the current value for the at least one phase and the voltage values for the other two phases if the voltage value for the at least one phase is unavailable.

2. A device for monitoring power according to claim 1, further comprising a selection mechanism, coupled to said processor, for selecting one of the two power calculations to be performed by said processor.

3. A device for monitoring power according to claim 2, wherein said selection mechanism comprises an identification value embedded in a control program.

4. A device for monitoring power according to claim 1, wherein said processor comprises a central processing unit executing a control program.

5. A device for monitoring power according to claim 4, further comprising a non-volatile memory element in which said control program is embedded.

6. A device for monitoring power according to claim 1, wherein said processor calculates power according to calculation (ii) when said device is placed in a 6S metering environment.

7. A device for monitoring power according to claim 1, wherein said processor calculates power according to calculation (i) when said device is placed in a non-6S metering environment.

8. A method of monitoring power in a power service having three phases, said method comprising:
    measuring current values for each phase of the power service;
    measuring voltage values for each available phase of the power service;
    calculating power for at least one phase of the service in one of the following two calculation methods: (i) by using the measured current and the measured voltage for the at least one phase when the measured voltage is available for the at least one phase; and (ii) by using the measured current for the at least one phase and the measured voltages for the other two phases when the measured voltage is unavailable for the at least one phase.

9. A method of monitoring power according to claim 8, further comprising selecting one of the two calculation methods to use in said calculating.

10. A method of monitoring power according to claim 8, further comprising:
    setting a variable in a control program to a predetermined value, and
    selecting one of the two calculation methods to use in said calculating based on the value of the variable.

11. A method of monitoring power according to claim 8, wherein said calculating uses calculation method (ii) in a 6S metering environment.

12. A method of monitoring power according to claim 8, wherein said calculating uses calculation method (i) in a non-6S metering environment.

13. A device for monitoring power in a wye power service having three phases, said device comprising:
    sampling means for sampling a current value and a voltage value from each of the three phases; and
    calculation means, coupled to said sampling means, for calculating power (i) by using the current value and the voltage value for the at least one phase when the voltage value for the at least one phase is available, and (ii) by using the current value for the at least one phase and the voltage values for the other two phases if the voltage value for the at least one phase is unavailable.

14. A device for monitoring power according to claim 13, further comprising selection means, coupled to said calculation means, for selecting one of the two power calculations to be performed by said processor.

* * * * *